United States Patent
Shinohara

(10) Patent No.: US 6,523,755 B2
(45) Date of Patent: Feb. 25, 2003

(54) SEMICONDUCTOR MEMORY DEVICE

(75) Inventor: Takayuki Shinohara, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/974,899

(22) Filed: Oct. 12, 2001

(65) Prior Publication Data

US 2002/0145920 A1 Oct. 10, 2002

(30) Foreign Application Priority Data

Apr. 10, 2001 (JP) ........................................ 2001-111259

(51) Int. Cl.[7] .............................................. G06K 19/06
(52) U.S. Cl. ........................................ 235/492; 235/436
(58) Field of Search .................................. 235/436, 492

(56) References Cited

U.S. PATENT DOCUMENTS 4,992,651 A * 2/1991 Takahira ..................... 235/492

* cited by examiner

*Primary Examiner*—Harold I. Pitts
(74) *Attorney, Agent, or Firm*—McDermott, Will & Emery

(57) ABSTRACT

The invention provides a semiconductor memory device which can easily constitute a large-capacity memory system for a compact information terminal at low cost. The semiconductor memory device (RAM) which receives a command from a CPU to read and write data is connected to a storage flash memory for reading and writing data in predetermined access units. The RAM includes a flash interface circuit for generating a control signal required for data access to the flash memory in synchronism with the command from the CPU, and a pseudo-SRAM serving as a memory element which can be randomly accessed. The RAM reads/writes data from/to either the flash memory or the pseudo-SRAM in accordance with the commands from the CPU.

18 Claims, 12 Drawing Sheets

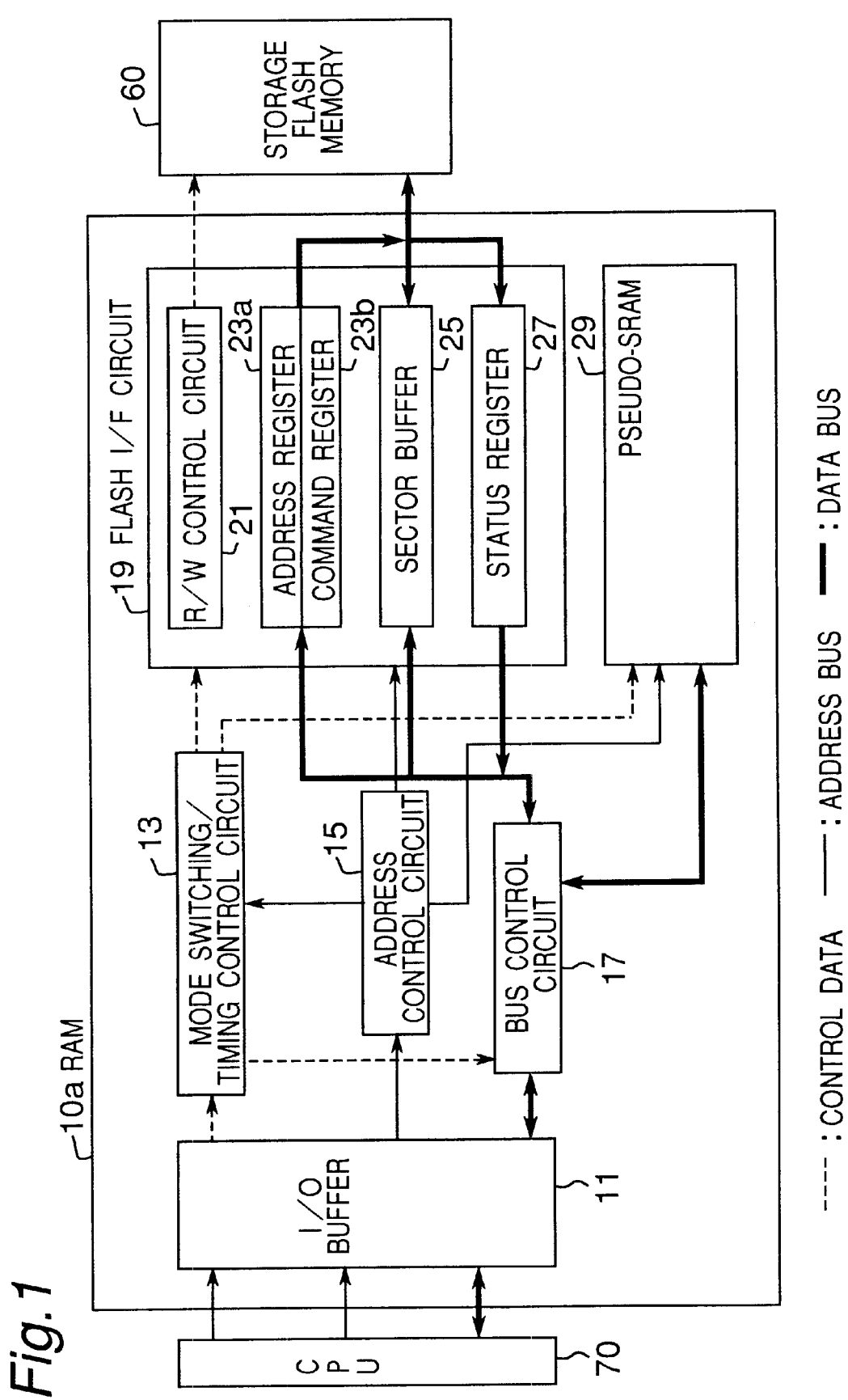

Fig.2

| OPERATION BLOCK | OPERATION (R/W/E) | /CS1 | /CS2 | /Flash | /WE | /OE | /RFSH | HOST ADDRESS | HOST DATA | NOTICE |
|---|---|---|---|---|---|---|---|---|---|---|
| PSEUDO-SRAM | READ | L | H | H | H | L | X | VALID | OUT | PSEUDO-SRAM→HOST |
| | WRITE | L | H | H | L | H | X | VALID | IN | HOST→PSEUD-SRAM |
| | REFRESH | H | H | H | H | H | L | ARBITRARY | Hi-Z | REFRESH PSEUD-SRAM |
| STORAGE FLASH MEMORY | BUFFER READ | H | L | H | H | L | X | VALID | OUT | SECTOR BUFFER→HOST |
| | BUFFER WRITE | H | L | H | L | H | X | VALID | IN | HOST→SECTOR BUFFER |
| | FLASH READ | H | H | L | H | L | X | VALID | Hi-Z | FLASH→SECTOR BUFFER |
| | FLASH WRITE | H | H | L | L | H | X | VALID | IN | SECTOR BUFFER→FLASH |
| | FLASH ERASE | H | H | L | H | H | X | ARBITRARY | ARBITRARY | ERASE SECTOR OF FLASH |
| | STANDBY | H | H | H | X | X | H | ARBITRARY | Hi-Z | |

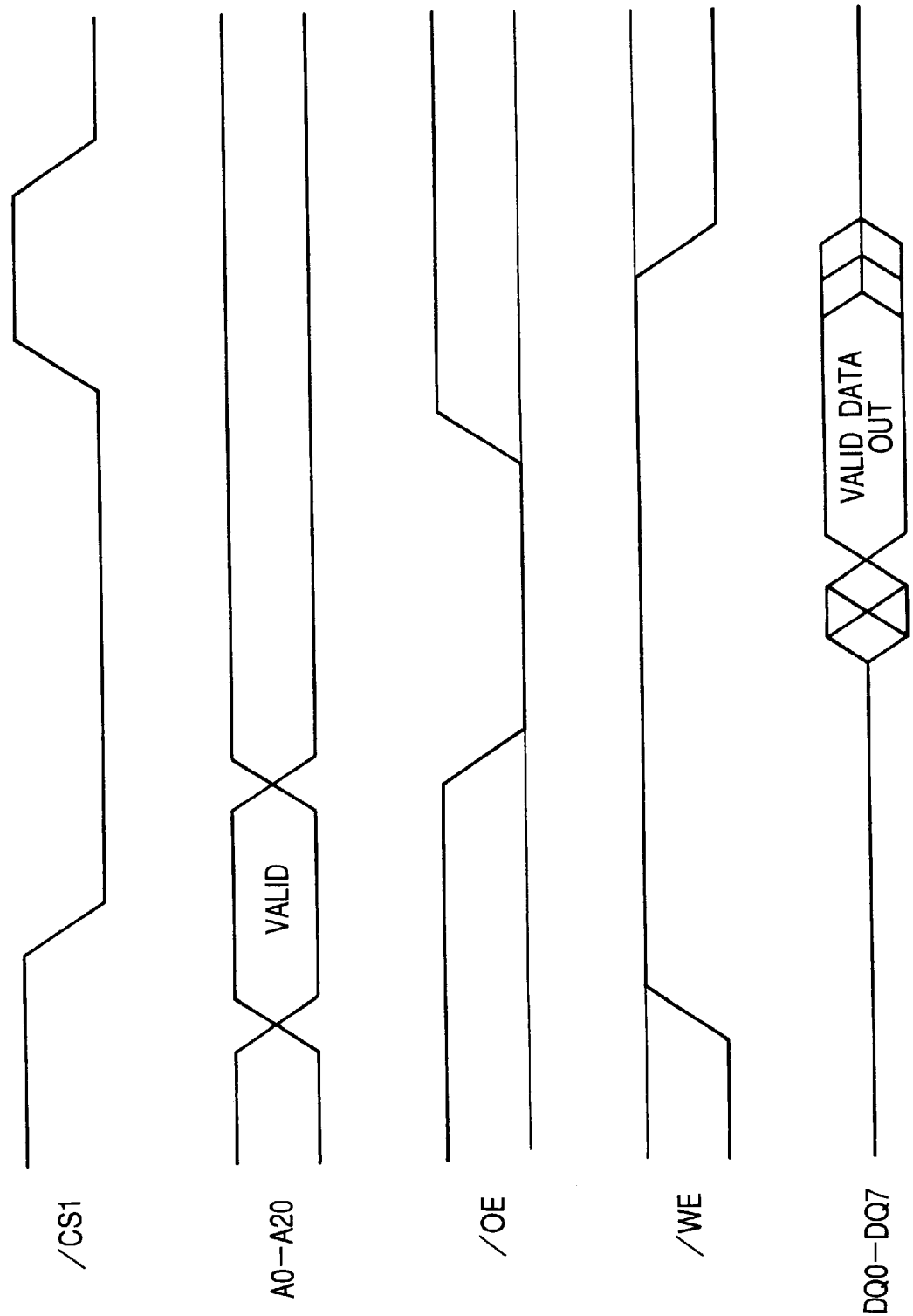

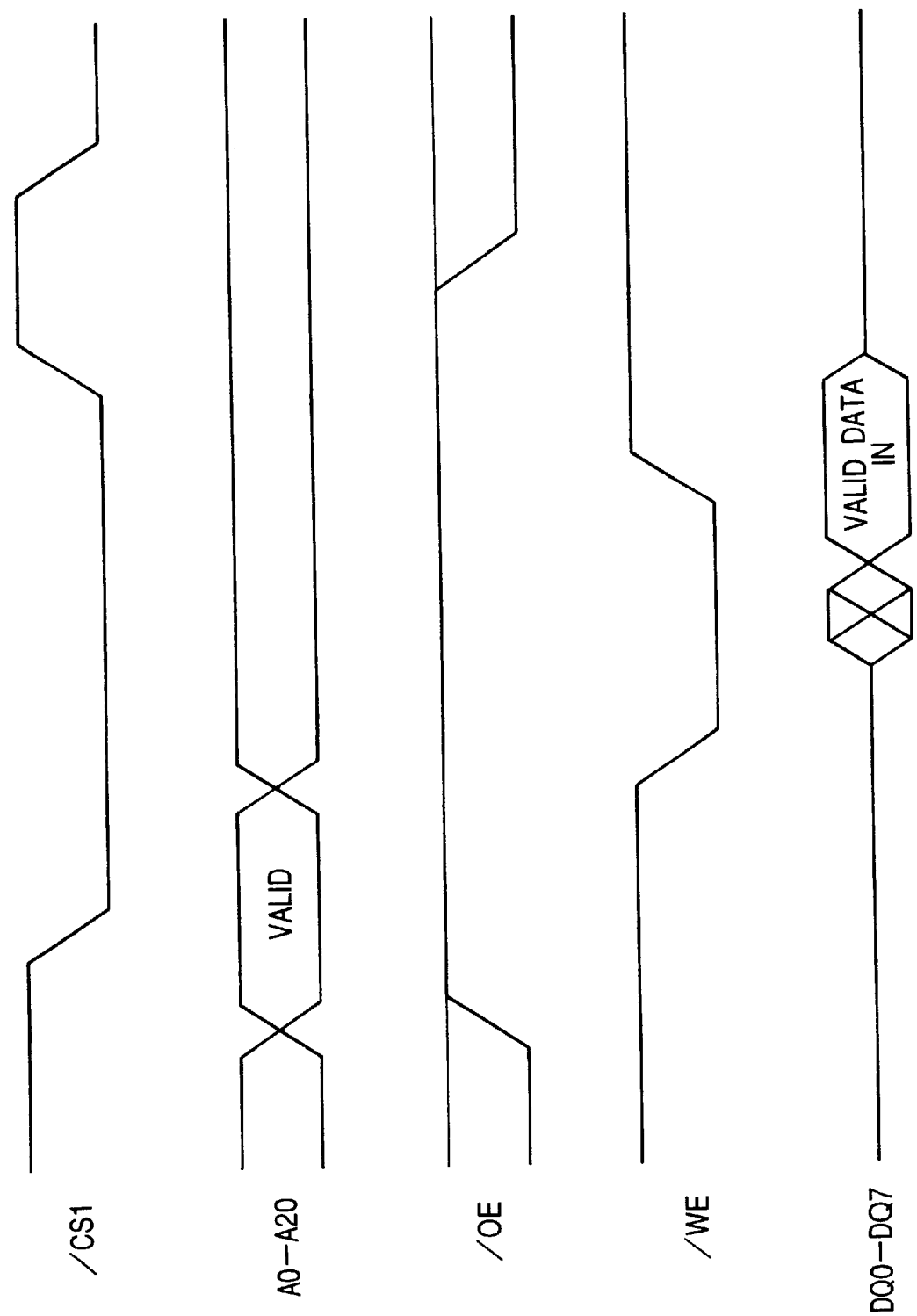

SEMICONDUCTOR MEMORY DEVICE

BACKGROUND OF THE INVENTION

1. Field of the Invention

The present invention relates to a memory system used in a small-size data terminal such as a portable telephone.

2. Description of the Related Art

In general, a memory system used in a small-size data terminal such as a portable telephone comprises a linear flash memory for storing instruction codes of a CPU and various data and an SRAM for temporarily storing data to be used as a work area of the CPU. In particular, in the portable telephone of which a area for mounting circuits is severely limited, an MCP (Multi Chip Package) in which the linear flash memory and the SRAM are incorporated in one package is employed.

With an increase of the number of functions of the data terminal and an increase in speed of a communication service in recent years, increases in capacity of the linear flash memory and the SRAM are eagerly required, and the memory capacities of the linear flash memory and the SRAM serving as single elements become short. A storage flash memory of AND/NAND which is a block (sector) access type suitable for a large-capacity storage application is manufactured as the flash memory. However, since these flash memories can hardly be connected to a CPU bus because of the characteristics of the flash memories, there are problems in which a dedicated interface circuit must be additionally connected, or only low-speed access by port connection to a CPU can be achieved. In addition, these storage flash memories can be only accessed in units of blocks, and cannot be randomly accessed. Therefore data is transferred onto another RAM, and the CPU should access the data stored in the RAM. For this reason, a large-capacity RAM is required disadvantageously.

For an increase in capacity of the RAM, a pseudo-SRAM which employs a one-transistor dynamic memory cell as well as a DRAM, and has the same interface specifications as those of an SRAM may be used. Although the pseudo-SRAM can increase the capacity, the problem of a shortage of capacity of a flash memory still remains.

SUMMARY OF THE INVENTION

The present invention provides a semiconductor memory device in place of an SRAM in the conventional memory system to solve the above problems, and has as its object to provide easily a large-capacity memory system for a small-size information terminal at low cost, by incorporating the interface circuit of the storage flash memory or a control function in the semiconductor memory device and giving the same configuration as that of a DRAM to the memory cell.

A first semiconductor memory device according to the invention receives commands from a CPU to read or write data. The semiconductor memory device is connected to an external nonvolatile memory for reading or writing data in a unit (access unit) of predetermined amount of data to be accessed. The memory device comprises an interface circuit for generating control signals required for data access to the nonvolatile memory in synchronism with the commands from the CPU, and a memory element which can be randomly accessed. Data are read or written from or to either the nonvolatile memory or the memory element in accordance with the commands from the CPU.

Since the first semiconductor memory device according to the present invention incorporates an interface circuit for generating a control signal required for data access to a nonvolatile memory connected to an external circuit, another interface circuit for the nonvolatile memory need not be arranged in a memory system constituted by a random access memory and a nonvolatile memory, and a compact and large-capacity memory system can be realized.

A second semiconductor memory device according to the invention receives commands from a CPU to read or write data. The semiconductor memory device is connected to an external nonvolatile memory for reading or writing data in a unit (access unit) of predetermined amount of data to be accessed. The semiconductor memory device comprise a memory control circuit for generating timing signals and control signals required for data access to the nonvolatile memory in asynchronism with the commands from the CPU, and a memory element which can be randomly accessed. Data are read or written from or to either of the nonvolatile memory or the memory element in accordance with the commands from the CPU.

Thus, when an external CPU simply transmits only address data and an operation command of a transfer source or a transfer destination to the semiconductor memory device in a normal memory cycle, data transfer between the semiconductor memory device and the external nonvolatile memory can be automatically performed. Therefore, the effect obtained by the first semiconductor memory device and a reduction in load of the external CPU and high-speed transfer of data can be realized.

In the semiconductor memory device, the memory element may include memory cells with a DRAM configuration of which each memory cell includes one transistor and one capacitor. The memory element can be accessed by an interface compatible to a general-purpose asynchronous SRAM and at a timing available to the general-purpose asynchronous SRAM. Thus a large-capacity memory system can be realized at low cost.

In the semiconductor memory device, the interface circuit may have a buffer memory having a capacity equivalent to data size of a sector as the access unit of the nonvolatile memory so as to enable data to be transferred between an arbitrary sector of the nonvolatile memory and the buffer memory by an instruction from the CPU. Thus the buffer memory can be used as a work area of the CPU.

The buffer memory can be randomly accessed in units of bytes. Thus the nonvolatile memory element can be randomly accessed from the CPU.

The semiconductor memory device further may comprise an ECC circuit for performing generation of an error correction code, error detection, and error correction to data transferred between the buffer memory and the nonvolatile memory element. Thus a memory system having high data reliability can be realized.

The semiconductor memory device may be stowed together with the nonvolatile memory in one package. Thus the number of pins of the entire circuit can be reduced, and the semiconductor memory device can be advantageous to the mounting area of a substrate or to wiring patterns. Therefore, a reduction in size of an information device such as a portable telephone using the semiconductor memory device, and mounting density of circuits can be raised.

BRIEF DESCRIPTION OF THE DRAWINGS

A better understanding of the invention will be obtained by reading the description of the invention below, with reference to the following drawings, in which:

FIG. 1 is a block diagram of a semiconductor memory device (RAM) according to the present invention (first embodiment);

FIG. 2 is a table for explaining the states of control signals corresponding to operation modes of the RAM according to the first embodiment;

FIG. 3 is a timing chart showing read timings of the RAM according to the first embodiment;

FIG. 4 is a timing chart showing write timings of the RAM according to the first embodiment;

DETAILED DESCRIPTION OF THE PREFERRED EMBODIMENTS

Figure 5:
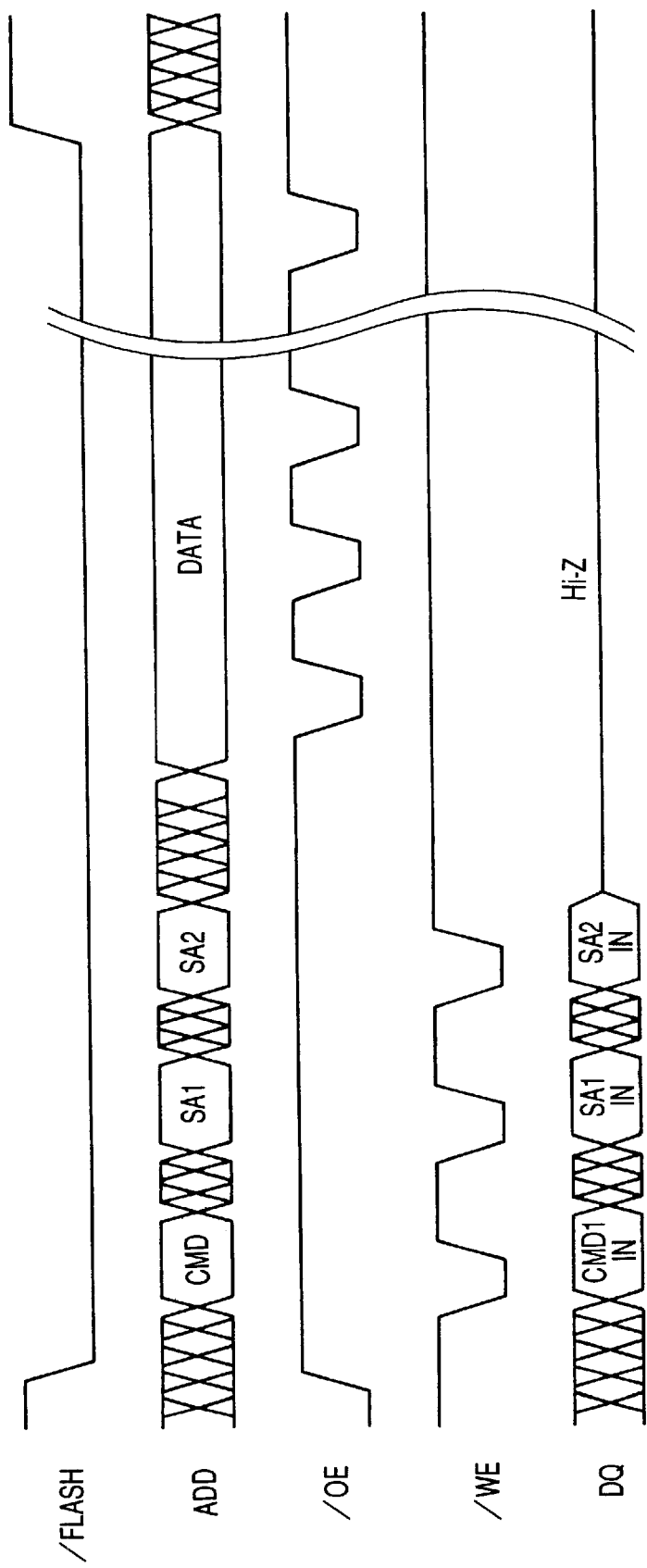
FIG. 5 is a timing chart (the first half) of a read operation for a storage flash memory.

Embodiments of a semiconductor memory device according to the present invention will be described below with reference to the accompanying drawings.

First Embodiment

<1.1 Configuration of RAM>

FIG. 1 shows the configuration of a RAM (Random Access Memory) according to the present invention and connections around the RAM. As shown in FIG. 1, a RAM 10*a* is used with a connection to a storage flash memory ("a flash memory" hereinafter) 60 and a CPU 70. The RAM 10*a* comprises a large capacity pseudo-SRAM 29 as a data storage means. The pseudo-SRAM 29 is a large capacity memory which employs one-transistor dynamic memory cells of the same configuration as that of the memory cells of a general DRAM having memory cells each including one transistor and one capacitor, and which has the same interface specifications as those of an SRAM. As such a pseudo-SRAM, for example, HM658512A series manufactured by Hitachi Ltd. or the like is available. The RAM 10*a* comprises a flash interface circuit (a "flash I/F circuit" hereinafter) 19 for controlling data transfer between the RAM 10*a* and the flash memory 60.

The flash interface circuit 19 includes an R/W control circuit 21, an address register 23*a*, a command register 23*b*, a sector buffer 25, and a status register 27.

The R/W control circuit 21 outputs control signals required for read or write operations for the flash memory 60.

The address register 23*a* stores an address received from the CPU 70. The command register 23*b* stores a command received from the CPU 70. The status register 27 stores status information representing whether the flash memory 60 is set in a busy state or not.

The sector buffer 25 is a buffer for temporarily storing data written in the flash memory 60 or data read from the flash memory 60. The RAM 10*a* reads or writes data from or to the flash memory 60 through the sector buffer 25. Data on the sector buffer 25 can be randomly accessed in units of bytes from the CPU 70.

The RAM 10*a* further has various circuit blocks. More specifically, the RAM 10*a* has an I/O buffer 11 for inputting and outputting data between the I/O buffer 11 and the CPU 70, a mode switching/timing control circuit 13 for generating an operation timing of a circuit block in the RAM 10*a*, an address control circuit 15, and a bus control circuit 17.

The mode switching/timing control circuit 13 generates signals for controlling the operations of the flash I/F circuit 19, the pseudo-SRAM 29, and the like in accordance with an operation mode designated by the CPU 70.

The address control circuit 15 decodes an address from the CPU 70 to decide whether a destination to be accessed is the flash memory 60 or the pseudo-SRAM 29.

The bus control circuit 17 selects one of the pseudo-SRAM 29 and the sector buffer 25 to connect the selected one to the I/O buffer 11.

<1.2 Operation of RAM>

When reading/writing data from/to the RAM 10*a* or the flash memory 60, the CPU 70 outputs control data, an address and data to the RAM 10*a*. The RAM 10*a* determines, from the address sent from the CPU 70, whether an access is directed to the pseudo-SRAM 29 or to the flash memory 60, and selects one of these memories to read or write data.

In the RAM 10*a*, when being input from the CPU 70, the control information and the address are passed to the mode switching/timing control circuit 13 and the address control circuit 15 through the I/O buffer 11. The address control circuit 15 decodes the address from the CPU 70, and outputs the decode result to the mode switching/timing control circuit 13. The mode switching/timing control circuit 13 activates any one of the flash I/F circuit 19 and the pseudo-SRAM 29 in the RAM 10*a* in accordance with the operation mode designated by the CPU 70 and the decoding result from the address control circuit 15, and generates in synchronism with an input signal from the CPU 70 timing signals at which the flash I/F circuit 19 or the pseudo-SRAM 29 operate.

In an access to the flash memory 60, the flash I/F circuit 19 generates control signals required for the access to the flash memory 60 in the R/W control circuit 21. The designate address from the CPU 70 and a command to the flash memory 60 is received by the address register 23*a* and the command register 23*b*, respectively. The flash I/F circuit 19 outputs the control signals generated by the R/W control circuit 21 to the flash memory 60.

Read/write operation to the flash memory 60 is performed through the sector buffer 25. Switching the bus of the pseudo-SRAM 29 and the flash I/F circuit 19 in the RAM 10*a* is controlled by the bus control circuit 17 in accordance with an output from the mode switching/timing control circuit 13. The status information of the flash memory 60 is stored in the status register 27 in the flash I/F circuit 19, and can be read through the status register 27.

FIG. 2 shows the values of control signals in various operation modes of the RAM 10*a*. As shown in FIG. 2, the following operations are realized by a combination of control signals (/CS1, /CS2, /Flash, /WE, /OE, /RFSH).

(1) A read/write/refresh operation for the pseudo-SRAM 29.

(2) A read/write operation for the sector buffer 25.

(3) A read/write/erase operation for the flash memory 60.

The operations (1) to (3) will be described below. The respective control signals have the following meanings:

/CS1: select the pseudo-SRAM 29 as an object to be accessed.

/CS2: select the sector buffer 25 as an object to be accessed.

/Flash: select the flash memory 60 as an object to be accessed.

/WE: designate a write operation of data.

/OE: designate a read operation of data.

/RFSH: designate a refresh operation of the pseudo-SRAM 29. In this case, the start symbols "/" of the respective control signals mean that operations are performed in an active-low.

(1) Read/Write/Refresh Operation for Pseudo SRAM

When the control signal CS1 is made active ("L"), the read/write operation for the pseudo-SRAM 29 can be performed. More specifically, the control signal /CS1 is set at "L", and the control signal /OE is set at "L", so that a read operation can be performed. At this time, in case where the memory capacity of the pseudo-SRAM 29 is set to be 16 Mb (2M word x 8 bit), twenty one address inputs A0 to A20 are required. These address inputs can be read/written at a timing equal to that of a general asynchronous SRAM. When the control signal /RFSH is set to "L" in a state in which the control signal /CS1 is inactive ("H"), a one-transistor dynamic memory cell is automatically refreshed.

FIG. 3 shows a timing chart of read timings. Valid data are output from the pseudo-SRAM 29 to data buses DQ0 to DQ7, when valid addresses are set to the address inputs A0 to A20, the control signal /CS1 goes to "L", and the control signal /OE goes to "L" (/WE goes to "H").

FIG. 4 shows a timing chart of write timings. Valid data on the data buses DQ0 to DQ7 are written in the pseudo-SRAM 29, when valid addresses are set in the address inputs A0 to A20, the control signal /CS1 goes to "L", and the control signal /WE goes to "L" (/OE goes to "H").

(2) Read/Write Operation for Sector Buffer

An access to the sector buffer 25 is controlled by the control signal /CS2. More specifically, when the control signal /CS2 is set at "L" and the control signal /OE is set at "L", a read operation can be performed. When the control signal /CS2 is set at "L" and the control signal /WE is set at "L", a write operation can be performed. The capacity of the sector buffer 25 is equal to the sector size of the flash memory 60. When an AND-type flash memory having 256 Mb (megabits) is employed as the flash memory 60, the sector buffer size is 2112 B (bytes) For this reason, twelve address inputs A0 to A11 are required.

(3) Read/Write/Erase Operation for Storage Flash memory

In this embodiment, all of operations of data reading from and data writing to the flash memory 60 are performed through the sector buffer 25. To access the flash memory 60, the control signal /Flash is set active ("L").

In this case, when the CPU 70 accesses to the flash memory 60 for a read/write operation and so on, the access is performed by an access to a data register which is a register provided logically. The data register is allocated with a predetermined address by which the data register can be logically recognized. When writing/reading data to/from the flash memory 60, the CPU 70 designates an address allocated to the data register to perform data reading and data writing. By using a control signal and a timing from the CPU 70 at this time, control for data transfer between the sector buffer 25 and the flash memory 60 is performed.

Figure 6:
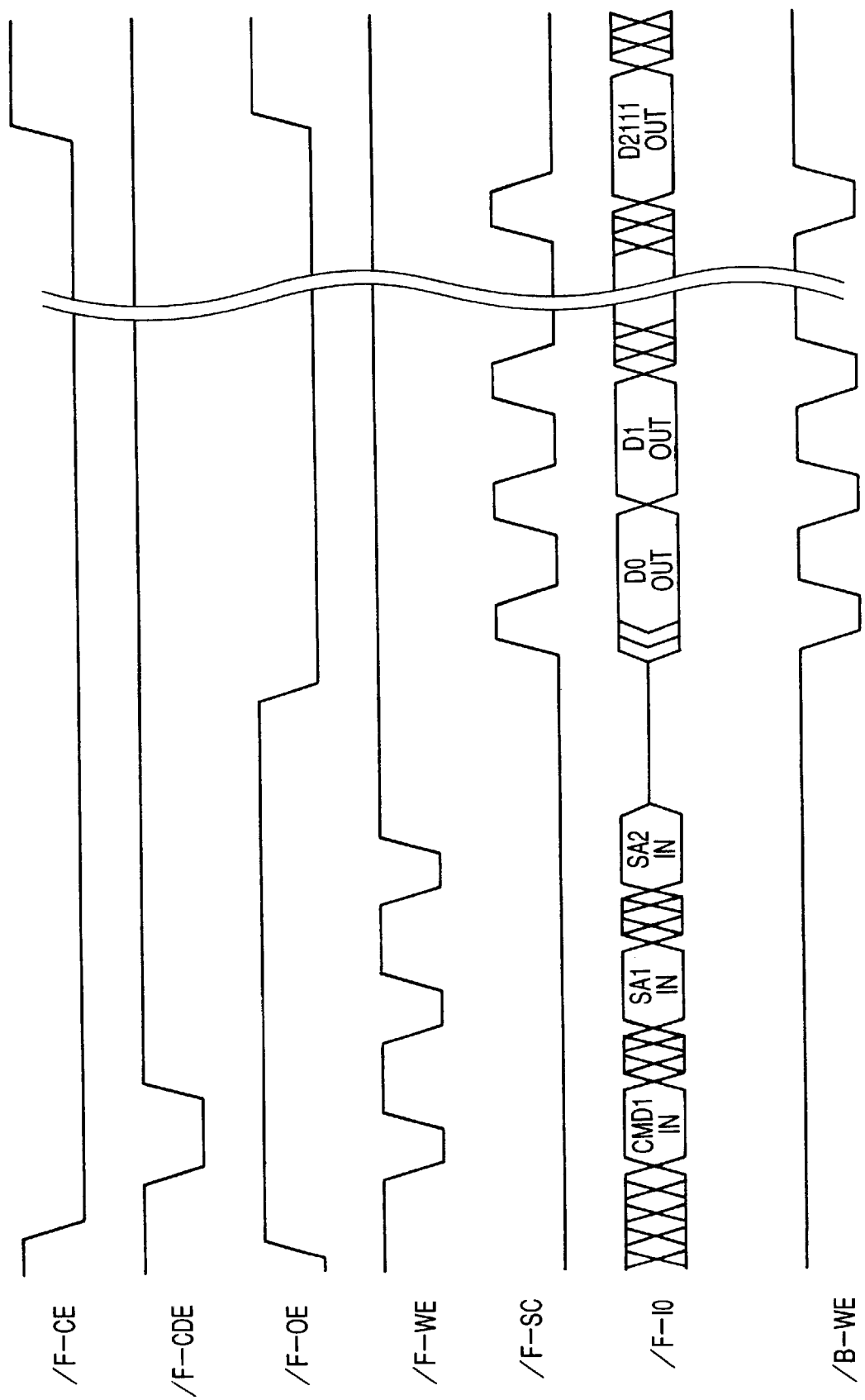
FIG. 6 is a timing chart (the second half) of a read operation for the storage flash memory.

First, a read operation will be described below by using the timing charts shown in FIGS. 5 and 6. The timing charts in FIGS. 6 and 7 share one time axis. In each of the timing charts, a signal with a notation of "F" represents the signal name of the flash memory 60 which is connected to the flash I/F circuit 19.

In a read operation of the flash memory 60, the control signal /Flash is made active ("L"), a read command (CMD1) for the flash memory 60 and a sector address (Add) for accessing the flash memory 60 are written in an address/command register 23. Since 16 k sectors of 2 kB exist in an AND-type flash memory of 256 Mb, sector addresses (A0 to A13) are divided to be input in two steps. In the example in FIG. 5, the address is divided into a sector address SA1 and a sector address SA2 to be input.

Thereafter, in synchronism with a read cycle (/OE signal) of 2 k times for a data register from the CPU 70, the R/W control circuit 21 of the flash I/F circuit 19 generates an SC (serial clock) signal (represented by F-SC in FIG. 6 and having the inverted value of the control signal /OE) to the AND-type flash memory, and read data (D0, D1, . . . , D2111) are output onto a data bus (F-IO) of the flash I/F circuit 19. At the same time, the data on this bus are written in the sector buffer 25 at the leading edge of a write signal (/B-WE, internal signal) to the sector buffer 25 generated by the control signal /OE. During the access from the CPU 70 to the data register, a CPU data bus (DQ0 to DQ7) is set in a high impedance state, no data is output. In this manner, the data of a designated sector of the flash memory 60 is transferred to the sector buffer 25 of the RAM 10*a*.

Figure 7:
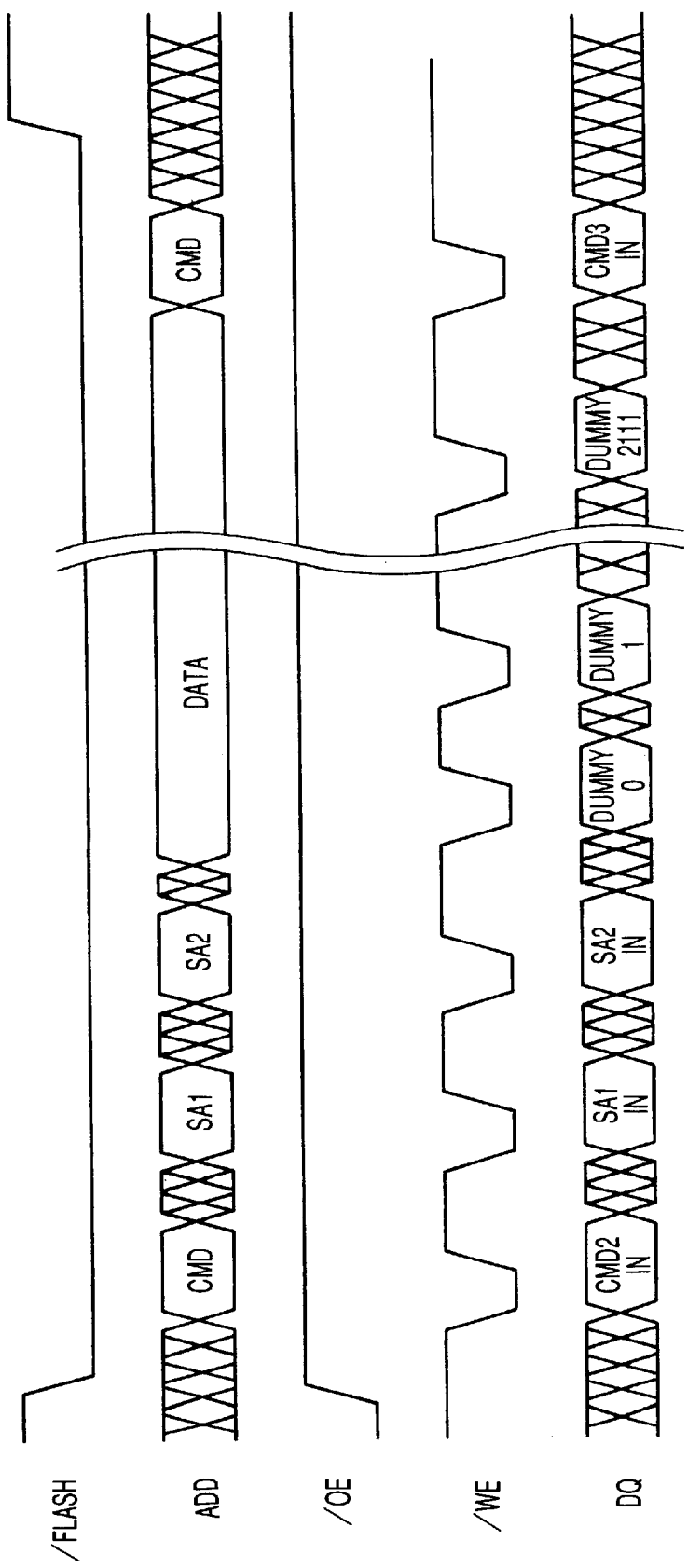
FIG. 7 is a timing chart (the first half) of a write operation for a storage flash memory.
Figure 8:
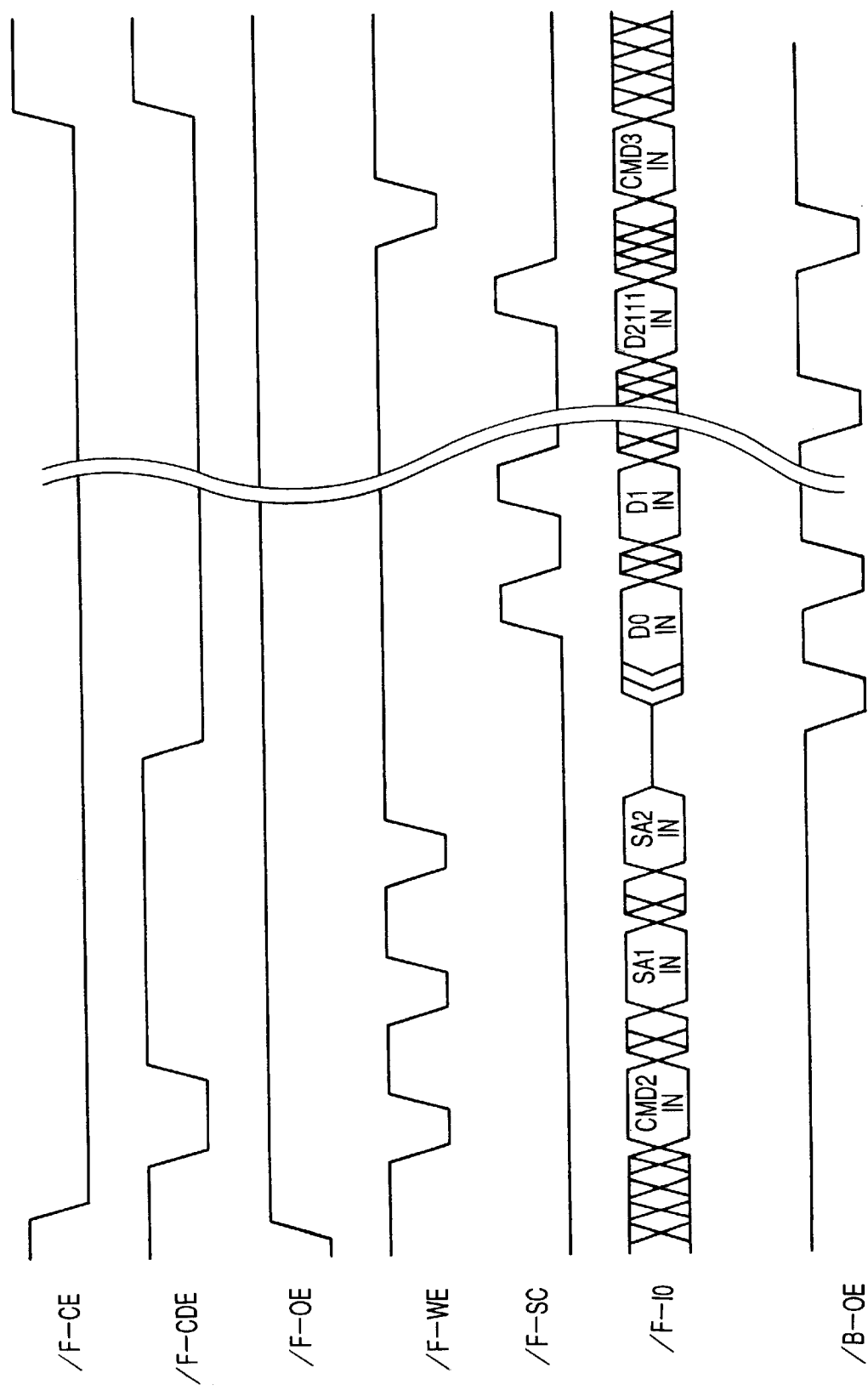
FIG. 8 is a timing chart (the second half) of a write operation for the storage flash memory.

A write operation to the flash memory 60 will be described below by using the timing charts shown in FIGS. 7 and 8. The timing charts in FIGS. 7 and 8 share one time axis.

In the case of a write operation, as in the read operation, a write command (CMD2) and a sector address serving as a write destination are input, a read signal (/B-OE) of the sector buffer 25 is generated in synchronism with a write cycle to a data register from the CPU 70, i.e., the control signal /WE, and the data on the sector buffer 25 are sequentially output to the data bus (F-IO) of the flash I/F circuit 19 from the start address. By an SC signal (F-SC) of the AND-type flash memory generated from the control signal /WE from the CPU 70, data (D0, D1, . . . , D2111) on the bus (F-IO) are written in a designated sector of the AND-type flash memory. In the AND-type flash memory, data to be written is latched at the leading edge of the SC signal. For this reason, when the SC signal is generated from the control signal /WE from the CPU 70, the inverted signal of the control signal /WE must be generated such that the inverted signal is delayed by access time of the sector buffer 25.

One sector of data which are input on data writing from the CPU 70 to the data register are dummy data which are not actually written in either of the sector buffer 25 and the flash memory 60. In the write operation to the AND-type flash memory, a command (CMD3 in FIGS. 6 and 7) for designating a start of a program to the AND-type flash memory after one sector of data (2112 B) are input is required.

Figure 9:
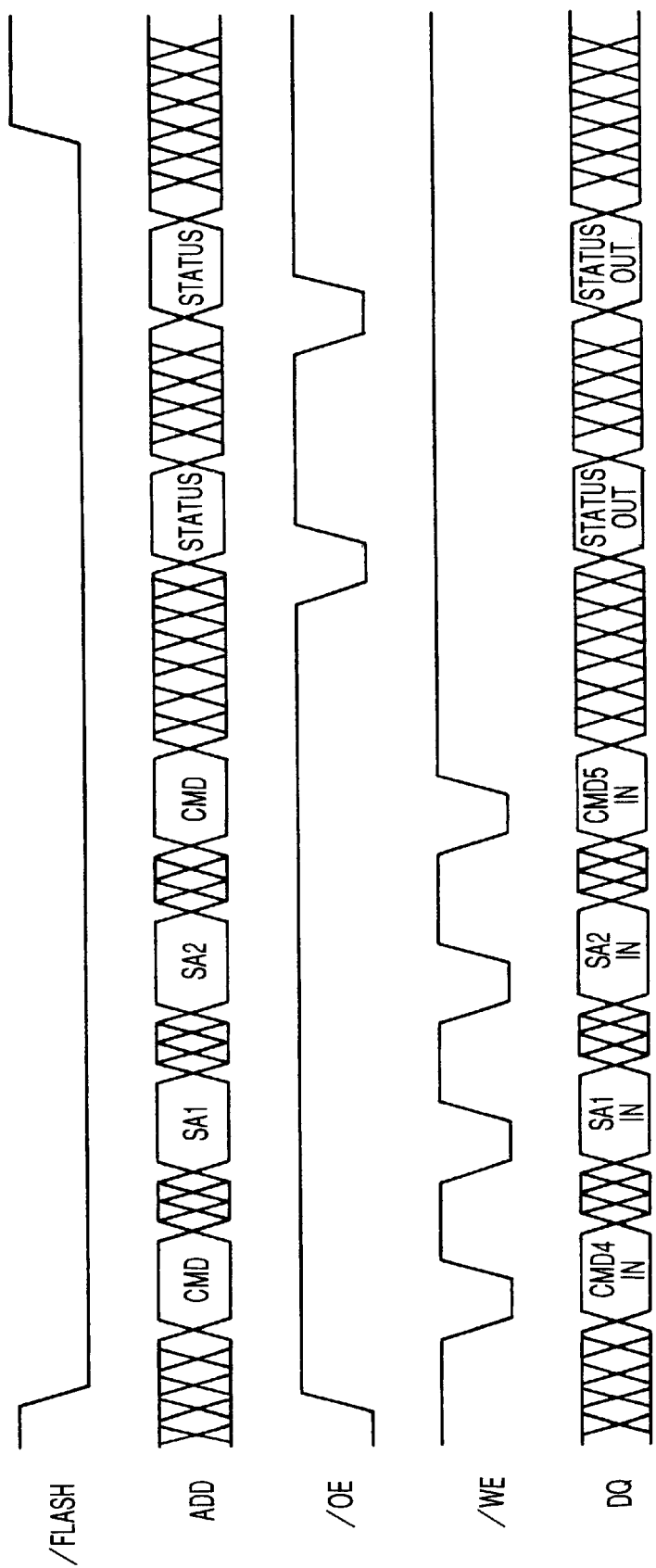
FIG. 9 is a timing chart (the first half) of an erase operation for a storage flash memory.
Figure 10:
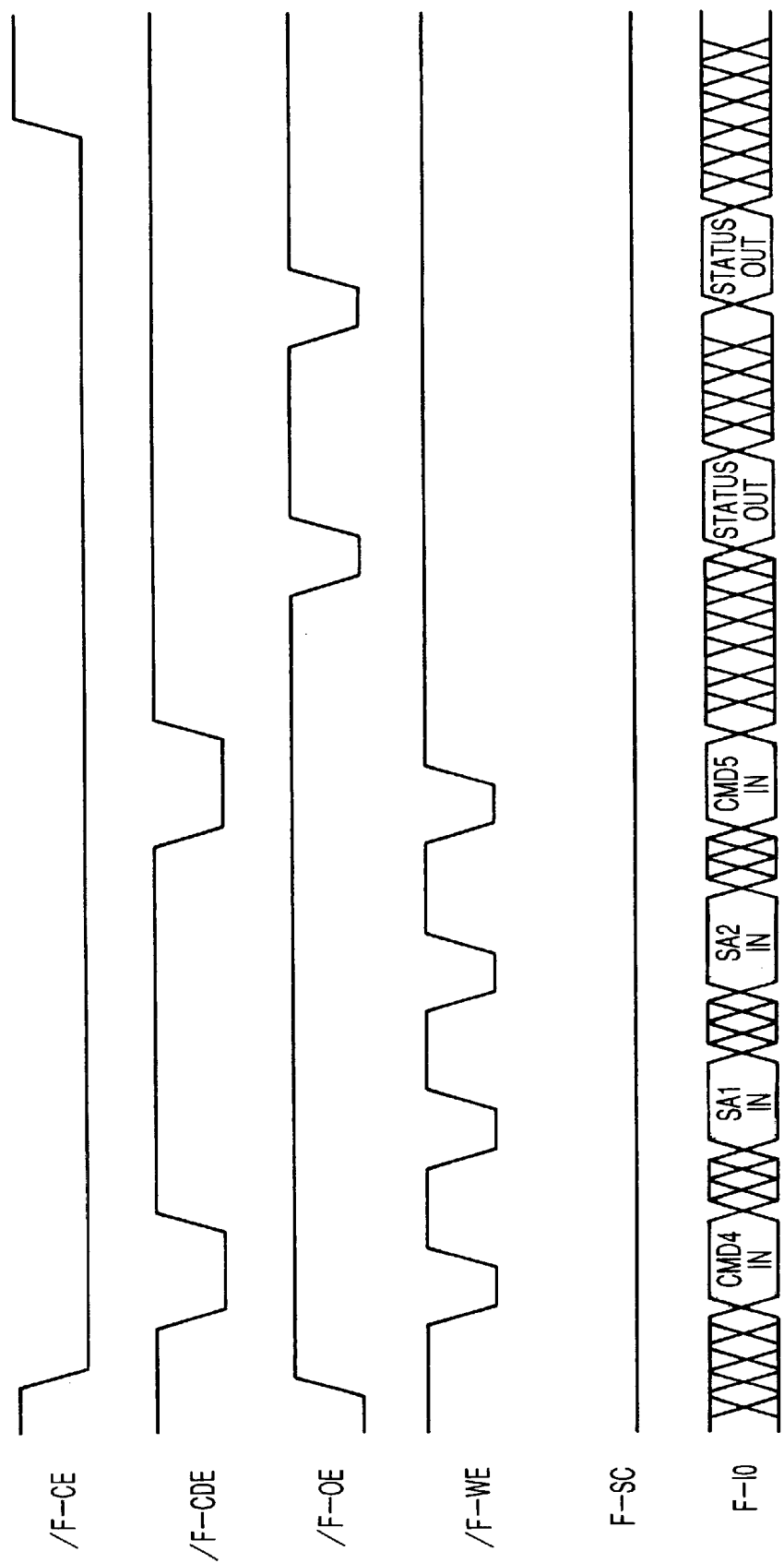
FIG. 10 is a timing chart (the second half) of an erase operation for the storage flash memory.

An erase operation to the flash memory 60 will be described by using the timing charts shown in FIGS. 9 and 10. The timing charts in FIGS. 9 and 10 share one time axis.

The erase operation (shown in FIGS. 9 and 10) is not accompanied with data input or data output. In an AND-type flash memory, the erase operation is started when, as in a read/write operation, an erase command (CMD4) is written in the command register 23b, the address of a sector to be erased is written in the address register 23a, and then a command (CMD5) for designating the start of the erase operation is written in the command register 23b.

The general write/erase operation of the flash memory requires time for an ms (millisecond) order. In an AND-type flash memory of 256 Mb, a write time and an erase time (standard time) per sector are 2.5 ms and 1 ms, respectively. When the status data of the flash memory is polled, the completion of the write/erase operation can be known. In this embodiment, with reference to the status register 27 in the flash I/F circuit 19, the status information of the flash memory 60 can be read.

As described above, in this embodiment, the flash I/F circuit 19 is incorporated in the RAM 10a, and a signal required to access the flash memory 60 is generated by the flash I/F circuit 19 from a signal input of a memory access from the CPU 70 to the RAM 10a, so that the storage flash memory 60 can be accessed. Thus, the storage flash memory 60 can be easily accessed from the CPU 70.

An input/output operation of data between the CPU 70 and the flash memory 60 is performed through the sector buffer 25 having the same size as that of the sector size of the storage flash memory 60 arranged in the RAM 10a, and the sector buffer 25 can be randomly accessed from the CPU 70. These allow the sector buffer 25 to be used as a work area of the CPU 70.

In addition, since a main storage area of the RAM 10a is constituted by a pseudo-SRAM comprising a one-transistor dynamic memory cell, a large-capacity RAM can be realized at low cost.

Second Embodiment

In the above embodiment, an example is described in which the flash I/F circuit 19 arranged in the RAM 10a generates signals required to access to the flash memory 60 connected to the RAM 10a and the timings of the accesses by using the timing of an access from the CPU 70 to the RAM 10a, that is, in synchronism with the timing of a clock of the CPU 70. In contrast to this, the RAM of the second embodiment receives only a sector address and an operation command to the flash memory 60 from the CPU 70 to generate an input signal and a timing to the flash memory 60 by itself. More specifically, the RAM of this embodiment performs a data access to the flash memory 60 in asynchronism with an access command from the CPU 70.

<2.1 Configuration of RAM>

Figure 11:
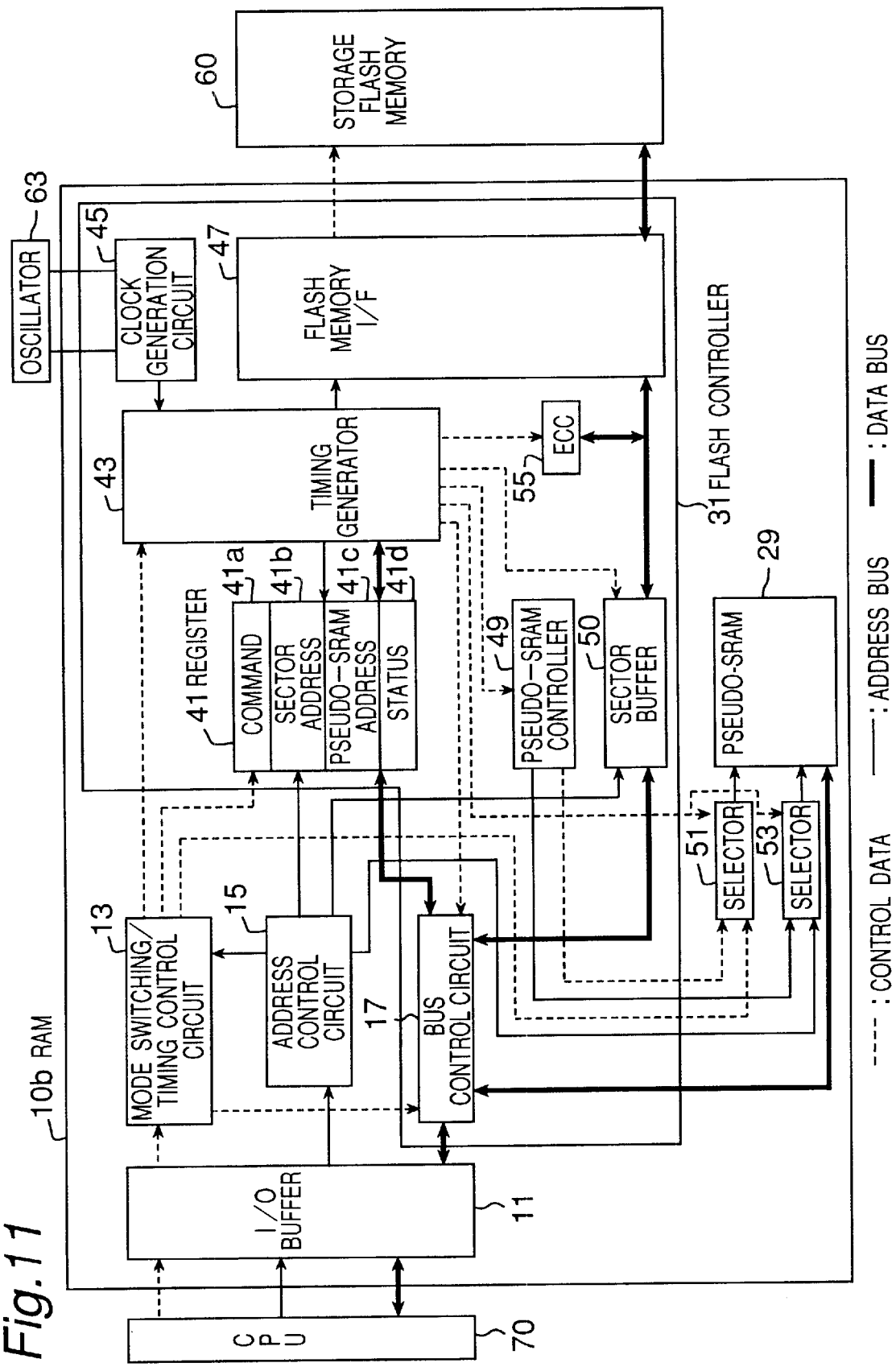
FIG. 11 is a block diagram of a semiconductor memory device (RAM) according to the present invention (second embodiment)

FIG. 11 is a functional block diagram of the RAM according to this embodiment. As shown in FIG. 11, a RAM 10b comprises a flash controller 31 for generating control signals and timing required for operations of a flash memory 60 and a pseudo-SRAM 29.

The flash controller 31 comprises a bus control circuit 17, a sector buffer 25, a group of registers 41, a timing generator 43, a clock generation circuit 45, a flash memory interface (I/F) 47, a PSRAM controller 49, and an ECC circuit 55. The flash controller 31 is constituted by only a sequential circuit (hardware) for generating various signals in synchronism with the clock.

The RAM 10b comprises selectors 51 and 53 for switching addresses and control data which are input to the pseudo-SRAM 29. The selectors 51 and 53 switch the addresses and control data which are input to the pseudo-SRAM 29 between in a data transfer operation between the pseudo-SRAM 29 and the flash memory 60 and in the other data transfer operations.

The group of registers 41 includes a command register 41a storing a command from a CPU 70, a sector address register 41b storing a sector address of the flash memory 60, a pseudo-SRAM address register 41c storing an address of the pseudo-SRAM 29, and a status register 41d storing status information.

The clock generation circuit 45 generates a basic internal clock based on an output from an external oscillator 63.

The ECC circuit 55 performs generation of check codes at data writing to the flash memory 60 (ECC coding process), and performs error detection/correction at data reading (ECC decoding process), for the data transferred between the flash memory 60 and the sector buffer 25.

The timing generator 43 generates timings of the respective blocks in the flash controller 31. More specifically, the timing generator 43 generates all timings required for operations of the flash memory 60 and the pseudo-SRAM 29 from basic internal clocks generated by the clock generation circuit 45 in asynchronism with the clock of the CPU 70.

The flash controller 31 determines its operation sequence on the basis of various parameters and various commands which are written by the CPU 70 into registers 41a to 41d of the register group 41. Data transfer between the flash memory 60 and the CPU 70 is performed through the sector buffer 25 as in the first embodiment. In addition, in this embodiment, the PSRAM controller 49 is newly arranged to enable data transfer between the sector buffer 25 and the pseudo-SRAM 29 under the control of the timing generator 43. Thus, a load on the CPU 70 can be reduced.

<2.2 Operation of RAM>

The description will be made to (1) a read operation from the storage flash memory 60, and (2) a sector data transfer operation from the sector buffer 25 to a designate address of the pseudo-SRAM, below.

(1) Read Operation from Storage Flash memory

The CPU 70 writes, in the register group 41, sector addresses and read commands of the storage flash memory 60 to be read in the sector address register 41b and the command register 41a. As to the write sequence, sector address 1 (SA1), sector address 2 (SA2), and finally a command (CMD) are written in this sequence. The address control circuit 15 and the mode switching/timing control circuit 13 detect a write operation to the command register 41a to feed a trigger signal to the flash controller 31. This trigger signal starts an internal operation controlled by the flash controller 31. More specifically, when the write operation in the command register 41a is detected, the busy bit of the status register 41d is set, and an access to the RAM 10b by the CPU 70 becomes impossible. Thereafter, the timing generator 43 generates signals and timings required for a read operation of the flash memory 60 from a reference clock of the clock generation circuit 45 according to a command written in the command register 41a. According to the timings, one sector of data are read from a sector set in the sector address register 41b from the flash memory 60, and the read data are transferred to the sector buffer 25 through the flash memory I/F 47.

In this embodiment, the ECC circuit 55 is provided between the flash memory 60 and the sector buffer 25, which enables error detection and correction of transfer data during transfer of the sector data. The ECC circuit 55 may be added to the configuration of the first embodiment in which the timing generator 43 is not provided. In this case, an additional cycle (clock) for error correction must be executed in a dummy cycle supplied from the external CPU 70. Therefore, a load on the external CPU 70 disadvantageously increases. In contrast to this, in this embodiment, since all clocks required for an internal operation are generated by the timing generator 43, such a problem does not occur.

Upon completion of the transfer process to the sector buffer 25, the flash controller 31 clears the busy bit of the status register 41*d*. In order to notify the CPU 70 of the completion of the transfer process, an interrupt output or a read//busy output generated in associated with clearance of the busy bit of the status register 41*d* may be provided.

(2) Transfer of Sector Data from Sector Buffer to Designate Address of Pseudo-SRAM The CPU 70 sets a write address in the pseudo-SRAM 29 into the pseudo-SRAM address register 41*c*, and then writes a command code into the command register 41*a*. The command writing to the command register 41*a* sets the busy bit of the status register 41*d* to a busy state, and subsequently the flash controller 31 starts the control of an internal operation. The bus control circuit 17 connects a bus between the sector buffer 25 and the pseudo-SRAM 29. Start data in the sector buffer 25 are sequentially read onto the internal bus under the control of the timing generator 43. At the same time, data are sequentially written to the pseudo-SRAM 29 from a designated address. Upon completion of the data transfer from the sector buffer 25 to the pseudo-SRAM 29, the busy bit of the status register 41*c* is cleared.

As described above, in this embodiment, the flash controller 31 for controlling the storage flash memory is provided in the RAM 10*b*, so that the RAM 10*b* generates signals and timings required to access the flash memory 60, the sector buffer 25 and the pseudo-SRAM 29, by itself. Thus, the CPU 70 may simply write only address data of a transfer source or a transfer destination and an operation command to the respective registers 41*b* and 41*a* in synchronism with a normal memory cycle, thereby allowing sector data to be automatically transferred in the RAM 10*b*. Therefore, in addition to the effect obtained by the first embodiment, a reduction in load of the external CPU 70 and high-speed transfer of data can be realized.

Furthermore, in this embodiment, the ECC circuit 55 is arranged between the flash memory 60 and the sector buffer 25, and thus transfer data between the flash memory 60 and the sector buffer 25 is subjected to an ECC coding/ECC decoding process. This allows the memory system to have high data reliability. Such an ECC circuit may be arranged in the RAM 10*a* such that an ECC coding/ECC decoding process is performed to data transferred between the flash memory 60 and the sector buffer 25.

The flash controller 31 in this embodiment is constituted by only sequential circuits (hardware) for generating various signals in synchronism with clocks. However, the flash controller 31 may incorporate a built-in CPU core and a memory storing the instruction codes of the CPU core to control the hardware. With this configuration, more flexible and advanced control can be performed.

In this embodiment, although a clock source is supplied by the external oscillator 63, an oscillation circuit may be mounted on the chip of the RAM 10*b*.

Third Embodiment

Figure 12:
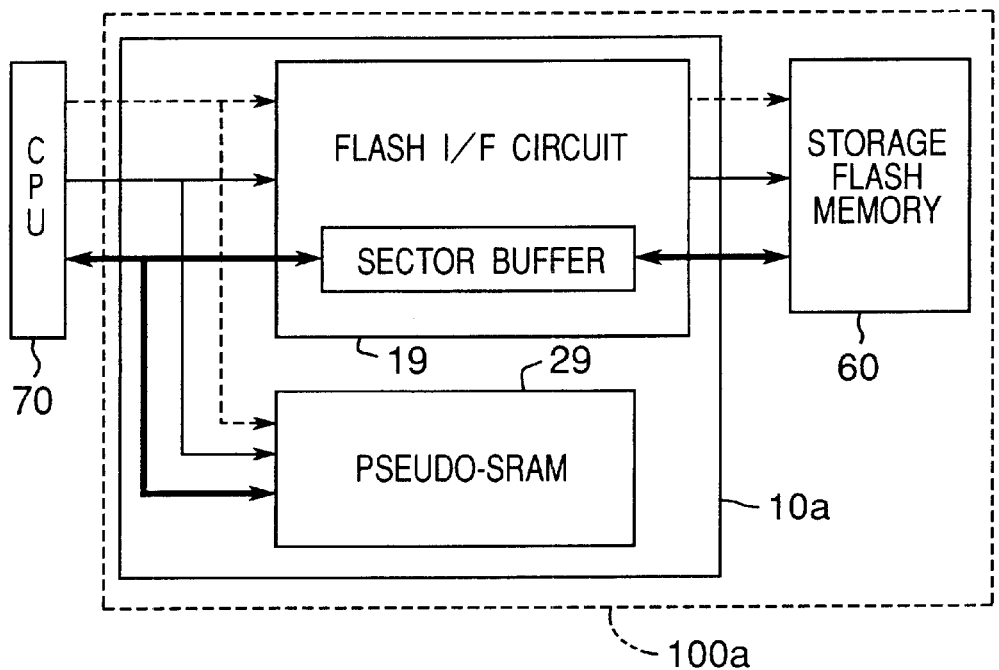
FIG. 12 is a block diagram for explaining a configuration in which the RAM and a storage flash memory according to the first embodiment are incorporated as an MCP (third embodiment)
Figure 13:
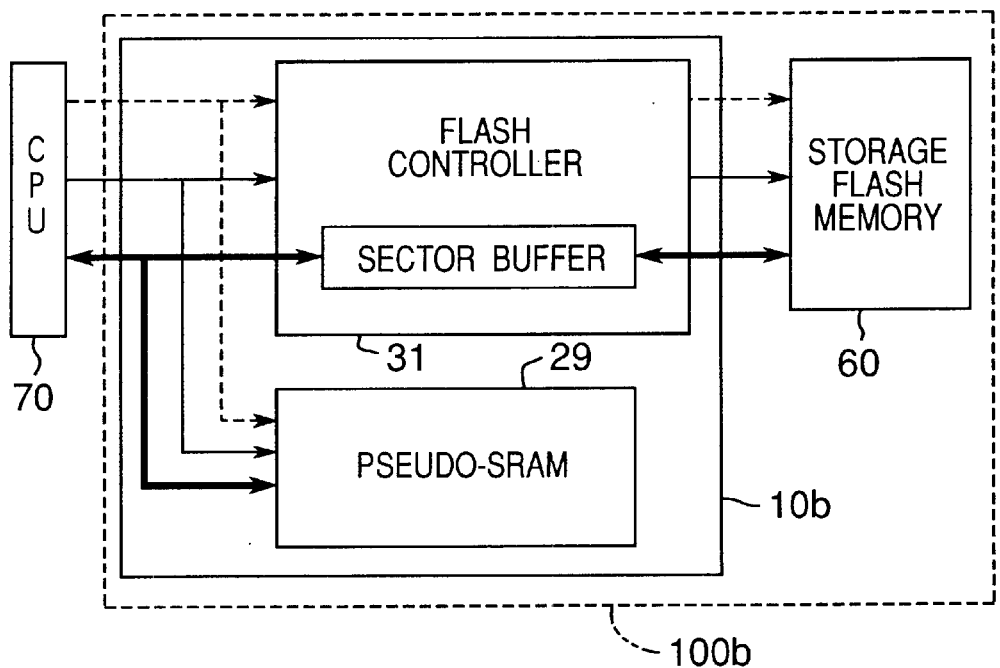
FIG. 13 is a block diagram (third embodiment) for explaining a configuration in which the RAM and a storage flash memory according to the second embodiment are incorporated as an MCP.

FIGS. 12 and 13 show examples of MCPs (Multi Chip Packages) in which each RAM described in the first or second embodiment and the flash memories 60 are stowed in one package or the same package. Employing such MCPs 100*a* and 100*b* allows all signals of the flash memory 60 to be connected to the flash I/F circuit 19 or the flash controller 31 in the RAM 10*a* or 10*b* without being output to the bus of the CPU 70. Therefore, the number of pins of the integrated circuit can be reduced. These configurations have advantages to mounting areas of substrates or to wiring patterns. Therefore, these configurations are useful to reduce the sizes of electric devices such as portable telephones and to mount components at high densities on the devices.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A semiconductor memory device which receives commands from a CPU to read or write data, the semiconductor memory device connected to an external nonvolatile memory for reading or writing data in a unit of predetermined amount of data to be accessed, the memory device comprising: an interface circuit for generating control signals required for data access to the nonvolatile memory in synchronism with the commands from the CPU; and a memory element which can be randomly accessed, wherein data are read or written from or to either the nonvolatile memory or the memory element in accordance with the commands from the CPU.

2. The semiconductor memory device according to claim 1, wherein the memory element includes memory cells with a DRAM configuration of which each memory cell includes one transistor and one capacitor, and the memory element can be accessed by an interface compatible to a general-purpose asynchronous SRAM and at a timing available to the general-purpose asynchronous SRAM.

3. The semiconductor memory device according to claim 1, wherein the interface circuit has a buffer memory having a capacity equivalent to data size of a sector which is the unit of predetermined amount of data to be accessed of the nonvolatile memory so as to enable data to be transferred between an arbitrary sector of the nonvolatile memory and the buffer memory by an instruction from the CPU.

4. The semiconductor memory device according to claim 3, wherein the buffer memory can be randomly accessed in units of bytes.

5. The semiconduct or memory device according to claim 3, further comprising an ECC circuit for performing generation of an error correction code, error detection, and error correction to data transferred between the buffer memory and the nonvolatile memory.

6. A semiconductor memory device which receives commands from a CPU to read or write data, the semiconductor memory device connected to an external nonvolatile memory for reading or writing data in a unit of predetermined amount of data to be accessed, the semiconductor memory device comprising: a memory control circuit for generating timing signals and control signals required for data access to the nonvolatile memory in asynchronism with the commands from the CPU; and a memory element which can be randomly accessed, wherein data are read or written from or to either the nonvolatile memory or the memory element in accordance with the commands from the CPU.

7. The semiconductor memory device according to claim 6, wherein the memory element includes memory cells with a DRAM configuration of which each memory cell includes one transistor and one capacitor, and the memory element can be accessed by an interface compatible to a general-purpose asynchronous SRAM and at a timing available to the general-purpose asynchronous SRAM.

8. The semiconductor memory device according to claim 6, wherein the memory control circuit has a buffer memory having a capacity equivalent to data size of a sector which is the unit of predetermined amount of data to be accessed of the nonvolatile memory so as to enable data to be transferred between an arbitrary sector of the nonvolatile memory and the buffer memory by an instruction from the CPU.

9. The semiconductor memory device according to claim 8, wherein the buffer memory can be randomly accessed in units of bytes.

10. The semiconductor memory device according to claim 8, further comprising an ECC circuit for performing generation of an error correction code, error detection, and error correction to data transferred between the buffer memory and the nonvolatile memory.

11. The semiconductor memory device according to claim 1 being stowed together with the nonvolatile memory in one package.

12. The semiconductor memory device according to claim 2, wherein the interface circuit has a buffer memory having a capacity equivalent to data size of a sector which is the unit of predetermined amount of data to be accessed of the nonvolatile memory so as to enable data to be transferred between an arbitrary sector of the nonvolatile memory and the buffer memory by an instruction from the CPU.

13. The semiconductor memory device according to claim 2 being stowed together with the nonvolatile memory in one package.

14. The semiconductor memory device according to claim 3 being stowed together with the nonvolatile memory in one package.

15. The semiconductor memory device according to claim 6 being stowed together with the nonvolatile memory in one package.

16. The semiconductor memory device according to claim 7, wherein the memory control circuit has a buffer memory having a capacity equivalent to data size of a sector which is the unit of predetermined amount of data to be accessed of the nonvolatile memory so as to enable data to be transferred between an arbitrary sector of the nonvolatile memory and the buffer memory by an instruction from the CPU.

17. The semiconductor memory device according to claim 7 being stowed together with the nonvolatile memory in one package.

18. The semiconductor memory device according to claim 8 being stowed together with the nonvolatile memory in one package.

* * * * *